(12) United States Patent
Gomyo

(10) Patent No.: US 6,545,379 B2
(45) Date of Patent: Apr. 8, 2003

(54) MOTOR PROVIDED WITH FLEXIBLE CIRCUIT BOARD

(75) Inventor: Masato Gomyo, Nagano (JP)

(73) Assignee: Sankyo Seiki Mfg. Co., Ltd., Nagano (JP)

( * ) Notice: Subject to any disclaimer, the term of this patent is extended or adjusted under 35 U.S.C. 154(b) by 0 days.

(21) Appl. No.: 10/056,980

(22) Filed: Jan. 23, 2002

(65) Prior Publication Data

US 2002/0117909 A1 Aug. 29, 2002

(30) Foreign Application Priority Data

Jan. 25, 2001 (JP) ........................................ 2001-016854

(51) Int. Cl.[7] .............................................. H02K 11/00
(52) U.S. Cl. ..................... 310/68 R; 310/67 R; 310/71; 29/596
(58) Field of Search .............................. 310/68 R, 67 R, 310/71, 254; 29/596, 598; 361/749

(56) References Cited

U.S. PATENT DOCUMENTS

| | | | | |
|---|---|---|---|---|
| 5,436,517 A | * | 7/1995 | Ogawa | 310/91 |
| 5,831,355 A | * | 11/1998 | Oku | 310/42 |
| 6,097,121 A | * | 8/2000 | Oku | 310/91 |
| 6,104,114 A | * | 8/2000 | Takeda et al. | 310/90 |
| 6,188,155 B1 | * | 2/2001 | Ishizuka et al. | 310/71 |
| 6,483,214 B1 | * | 11/2002 | Oclsch | 310/68 R |

* cited by examiner

Primary Examiner—Thanh Lam
(74) Attorney, Agent, or Firm—Hogan & Hartson, LLP

(57) ABSTRACT

A motor includes a stator core mounted to a base frame and includes salient pole sections extending radially from the stator core and each of the plurality of salient pole sections is provided with stator coils wound around each of the salient pole sections. The motor also includes a sheet-shaped flexible circuit board that has a flexible main body portion provided with land portions to which each of the terminal portions of the stator coils is electrically connected.

The flexible main body portion of the flexible circuit board is provided with elastic extending portions extending between the salient pole sections, the land portion is formed on each of the elastic extending portions, the elastic extending portion is bent by the flexible main body portion being mounted to the fixed member, and each of the land portions of the elastic extending portions is pushed against the fixed member by the elastic force due to the bending.

20 Claims, 17 Drawing Sheets

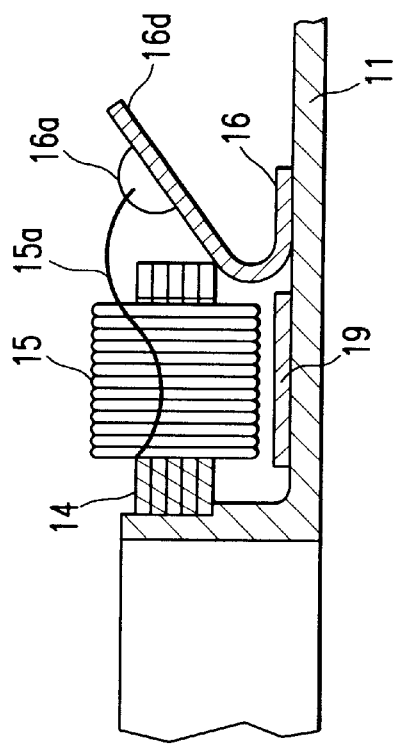
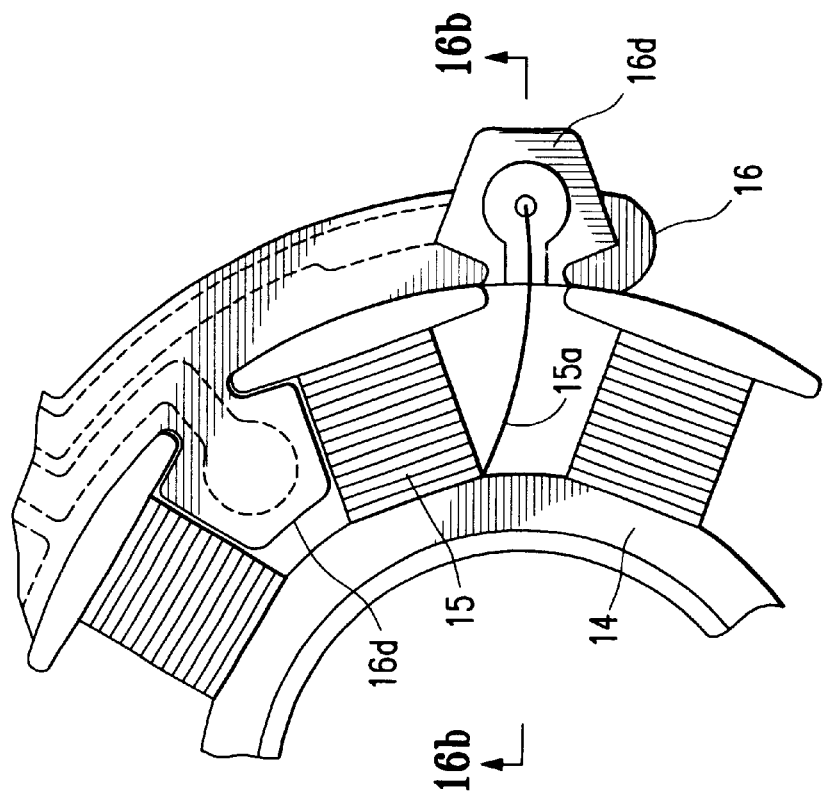
FIG. 16b
FIG. 16a

MOTOR PROVIDED WITH FLEXIBLE CIRCUIT BOARD

BACKGROUND OF THE INVENTION

1. Field of the Invention

The present invention relates to improvements on motors, and more particularly, to a motor provided with a flexible circuit board having land portions that are electrically connected to the terminal portions of stator coils extending from the motor.

2. Related Art

In typical motors, a shaft member and a bearing member are rotatably supported by each other using a base frame to which a stator core is fixed. A stator coil is wound around each of a plurality of salient pole sections of the stator core. The terminal portion of the stator coil is, for example, soldered to a land portion located on a sheet-shaped flexible circuit board. The flexible circuit board is provided with a wiring pattern and is arranged to extend out radially from the soldered land portion and protrude from the motor.

In an example shown in FIG. 18, the terminal portion of the stator coil 1, which is, for example, a power feeding lead wire 1a, extends from the motor through a hole 3 which penetrates the base frame 2. An insulator member (an insulating paper) 4 is provided on an inside surface (the upper surface of FIG. 18) of the base frame 2. The insulator member 4 includes a hole for accommodating the lead wire 1a. Lead wire 1a also passes through the hole of the insulator member 4 and the hole 3 of the base frame 2. A flexible circuit board 5 for signal transmission is provided on the outside surface (the underside surface of FIG. 18) of the base frame 2. Flexible circuit board 5 covers an opening portion of the hole 3 (the under surface in FIG. 18). The power feeding lead wire 1a extends outside from the motor by protruding through holes which are provided in the flexible circuit board 5 and the base frame 2. The power feeding lead wire 1a is electrically connected to the printed circuit board by soldering the feeding lead wire 1a to land portion 6 located on the flexible circuit board 5.

Motors configured in the manner, wherein the lead wire 1a is soldered to land portion 6 of the flexible circuit board 5, cannot be manufactured such that the thickness of the motor thin. For example, with a motor having a thickness along an axial direction of 4 mm or less, the thickness ratio of soldering the feed lead wire to the land portion increases considerably with respect to the thickness of the entire motor even when the lead wire used is 0.1 mm in diameter. The soldered thickness of the lead wire of size 0.1 mm usually increase the size of the wire to about 0.5 mm. Therefore, the electrical connecting portion of the terminal portion of the stator coil 1 and the flexible circuit board 5 creates a large problem when trying to reduce the thickness of the motor.

To solve this problem, attempts have been made to absorb the thickness of the soldered land portion 6 by cutting out a part of the base frame 2 so as to put the soldered land portion 6 in the cutting part or by forming an opening portion at the corresponding area of the soldered land portion 6 so as to put the soldered land portion 6 in the opening portion. Since the thickness of the base frame 2 is often thin to make the motor thinner, however, these solutions are inadequate because the thin base frame 2 provided with the cutting part or opening portion lacks rigidity.

Alternatively, a motor is provided with a flexible circuit board that includes a main body portion and terminal portions. The terminal portion is formed extending from the main body portion and bent in a slanted direction towards a slot space between the salient pole sections of a stator core. A coil end portion is soldered to a land portion provided on each of the terminal portions. However, in this structure described above, both side sections of each terminal portion are engaged with neighboring salient pole sections respectively so that the terminal portion does not move up in the slot space only by way of the elastic engagement of its both side sections with the neighboring salient pole sections. Thus, the bending state of the terminal portion is extremely unstable in this example. Furthermore, when the terminal portions are disengaged from the salient pole sections, the land portion move in an axial direction and come into contact with other metal parts, which may result in a short-circuit.

Thus, there exists a need to provide a motor that is configured in a simple and thinner construction with high reliability, wherein the soldering section in a land portion of a flexible circuit board is held in an extremely stable condition.

SUMMARY OF THE INVENTION

In according with one embodiment of the present invention, a motor includes a stator core mounted to a base frame and includes salient pole sections extending radially from the stator core and each of the plurality of salient pole sections is provided with stator coils wound around each of the salient pole sections. The motor also includes a sheet-shaped flexible circuit board that has a flexible main body portion provided with land portions to which each of the terminal portions of the stator coils is electrically connected. The flexible main body portion of the flexible circuit board is provided with elastic extending portions extending between the salient pole sections, the land portion is formed on each of the elastic extending portions, the elastic extending portion is bent by the flexible main body portion being mounted to the fixed member, and each of the land portions of the elastic extending portions is pushed against the fixed member by the elastic force due to the bending.

According to one embodiment of the present invention, a cut portion assisting for bending of the elastic extending portion is provided in a connecting portion between the flexible main body portion and the elastic extending portion of the flexible circuit board. Thus, the bending of the elastic extending portion is easy and productivity of the motor is improved.

According to one embodiment of the present invention, an insulation member is provided on the surface of the fixed member to which a land portion is pushed. Thus, electric reliability of the motor is attained.

In addition, according to one embodiment of the present invention, a rotor magnet is attached to a rotor, a magnetic attraction member is provided on the base frame such that the rotor magnet can be attracted in an axial direction for regulating a thrust position of the rotor, and the flexible main body portion of the flexible circuit board is retained to the base frame by the magnetic attraction member. Thus, extra fixing members for the flexible circuit board are unnecessary, a satisfactory fixed state is obtained with low cost, and the construction of the motor is simplified.

Further, according to one embodiment of the present invention, a guide groove is provided in the magnetic attraction member or the base frame such that the flexible main body portion of the flexible circuit board can be easily drawn toward the outside of the motor, and thus, the flexible circuit board can be disposed along the guide groove with ease and precision.

Also, according to one embodiment of the present invention, a guide groove is provided in the fixing member of the stator core or the base frame such that the flexible main body portion of the flexible circuit board can be easily drawn towards the outside of the motor.

Also, according to one embodiment of the present invention, the position of the drawing out from inside of the motor for the flexible circuit board is arranged in a circumferential direction except the range of the scanning zone for the head and the head actuator. Consequently, the height dimension of the drive device may not be increased. Also, according to one embodiment of the present invention, a plate is attached to the base frame and the land portions of the elastic extending portions are firmly held against the plate instead of the base frame. Other features and advantages of the invention will be apparent from the following detailed description, taken in conjunction with the accompanying drawings that illustrates, by way of example, various features of embodiments of the present invention.

BRIEF DESCRIPTION OF DRAWINGS

FIGS. 16a–16b shows an explanatory assembly view that illustrates a process for connecting a stator coil of the coil-wound stator core assembly with a land portion of the flexible circuit board.

DETAILED DESCRIPTION OF THE PREFERRED EMBODIMENTS

A motor according to the present embodiment which is applied to a hard disk drive (HDD) is described as follows with reference to accompanying drawings.

Figure 1:
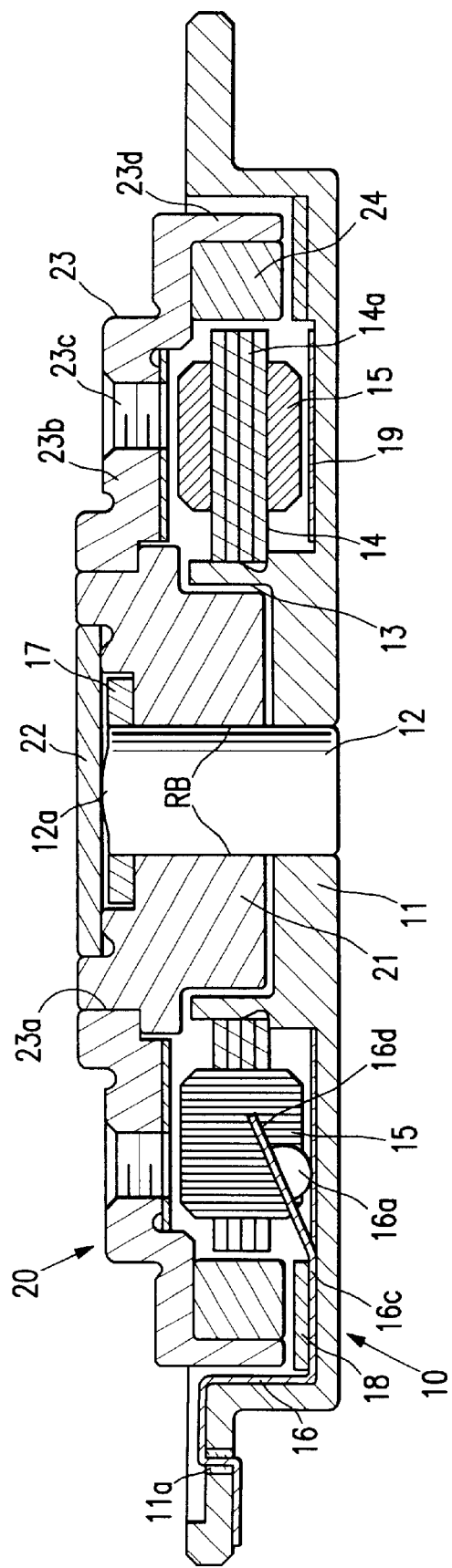
FIG. 1 shows a longitudinal section explanatory view of an embodiment of the present invention that is applied to a motor for a hard disk drive (HDD).
Figure 2:
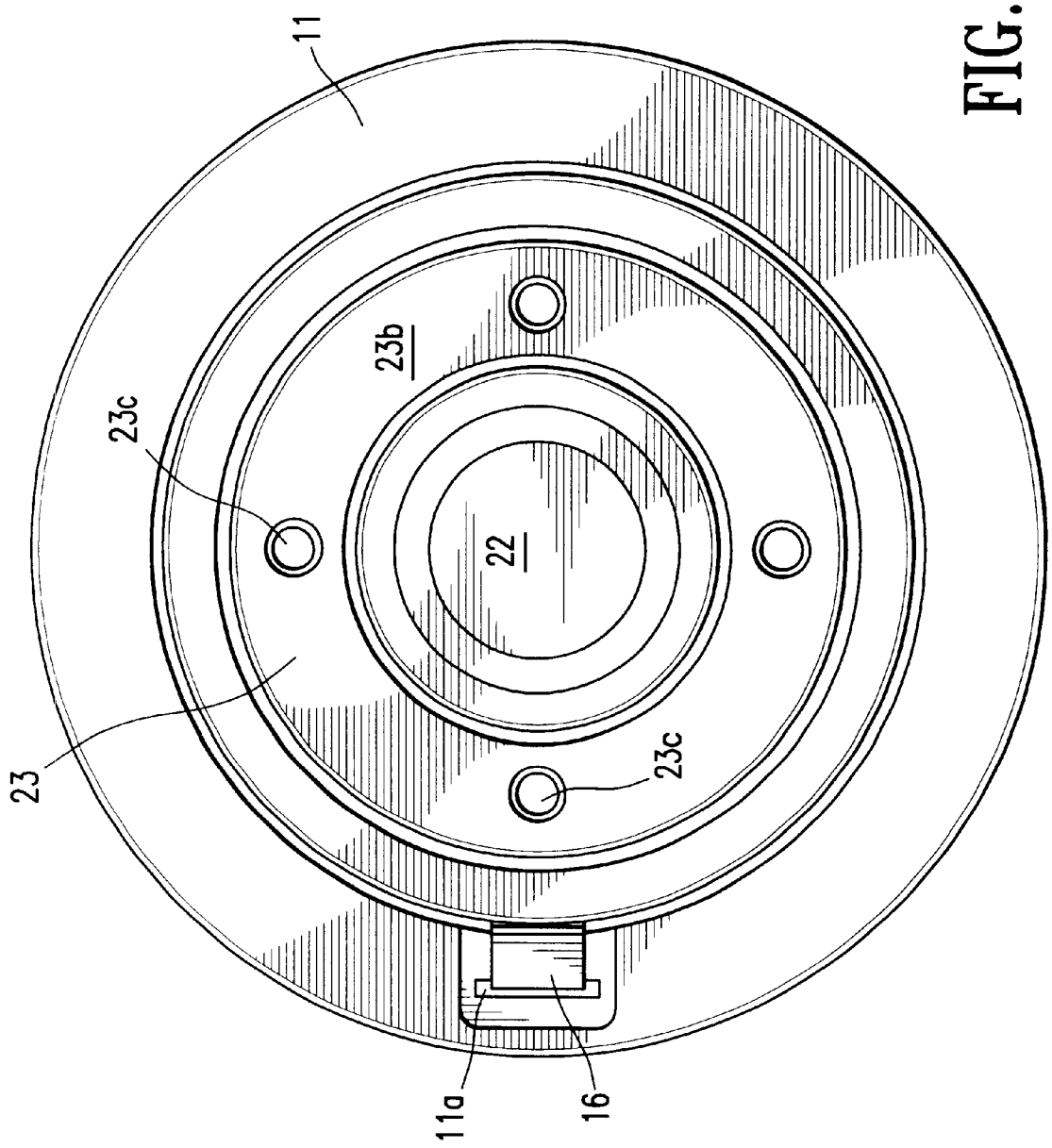
FIG. 2 shows a plane explanatory view of the motor shown in FIG. 1.
Figure 4:
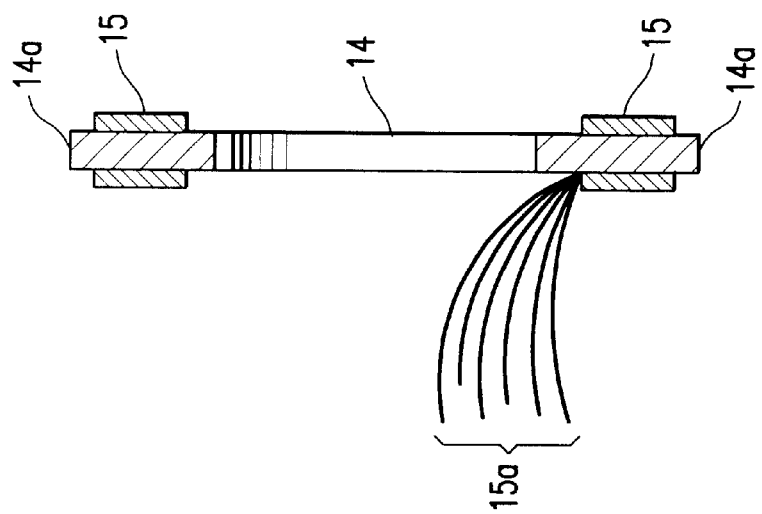
FIG. 4 shows a longitudinal section explanatory view of the coil-wound stator core assembly shown in FIG. 3.
Figure 3:
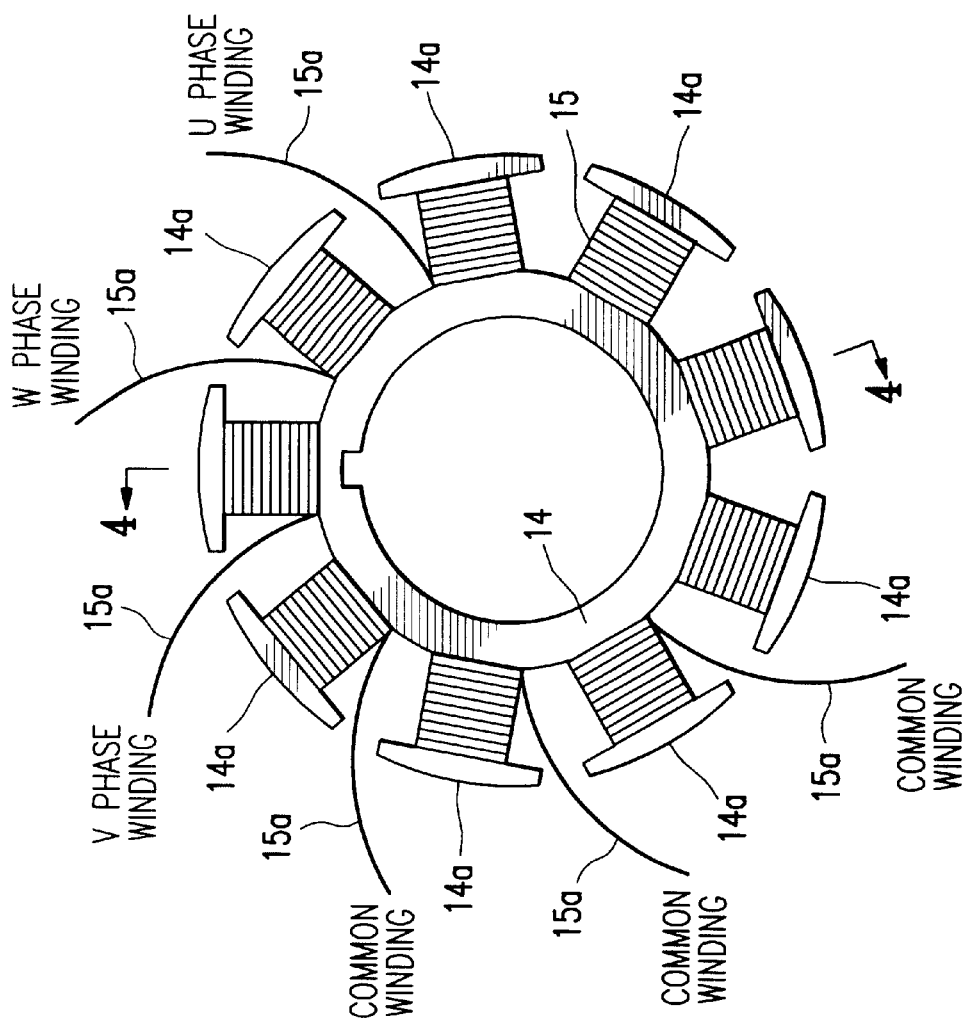
FIG. 3 shows a plane explanatory view that illustrates a coil-wound stator core assembly utilized in the motor shown in FIG. 1.
Figure 5:
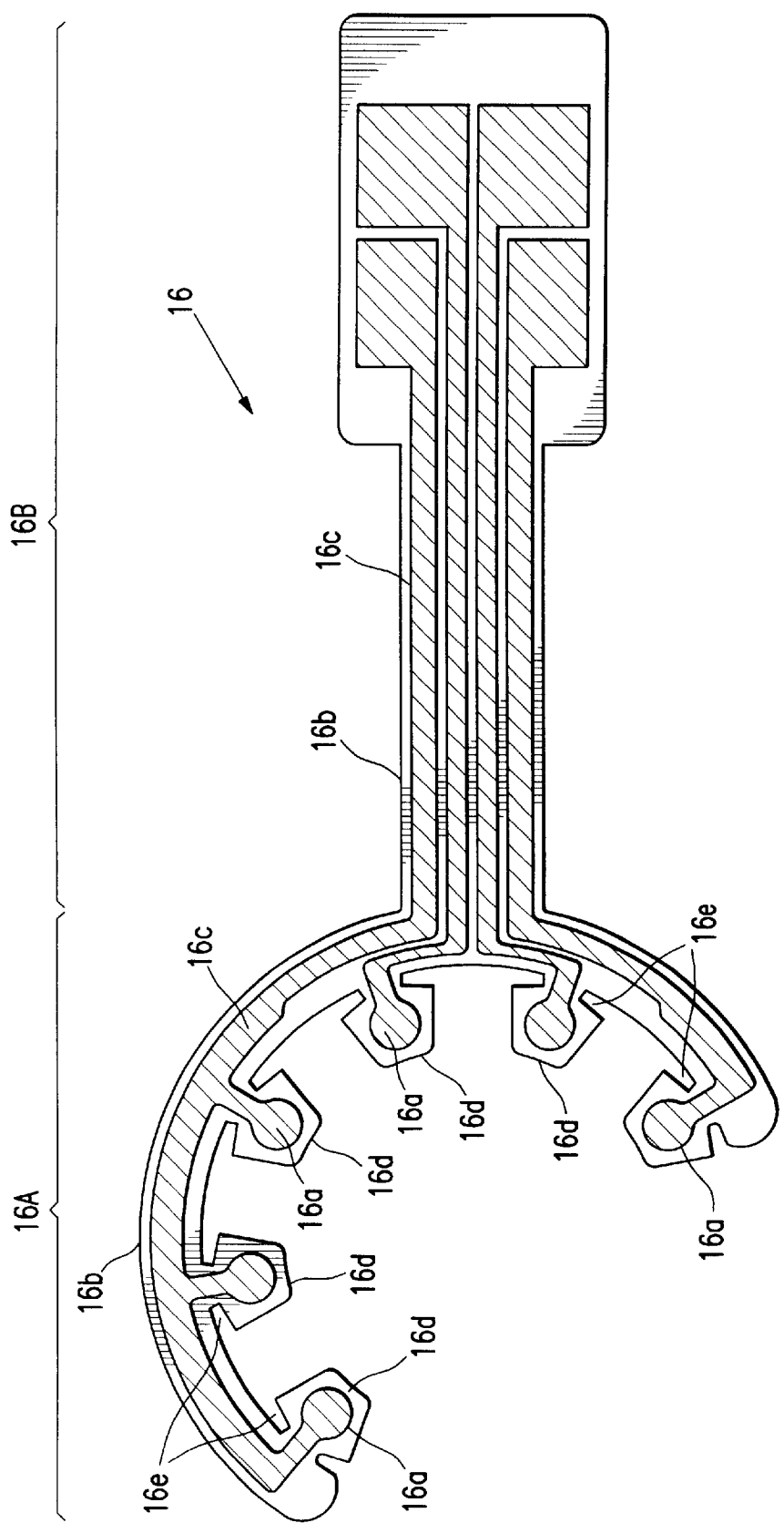
FIG. 5 shows a plane explanatory view that illustrates a flexible circuit board (FPC) utilized in the motor shown in FIG. 1.
Figure 6:
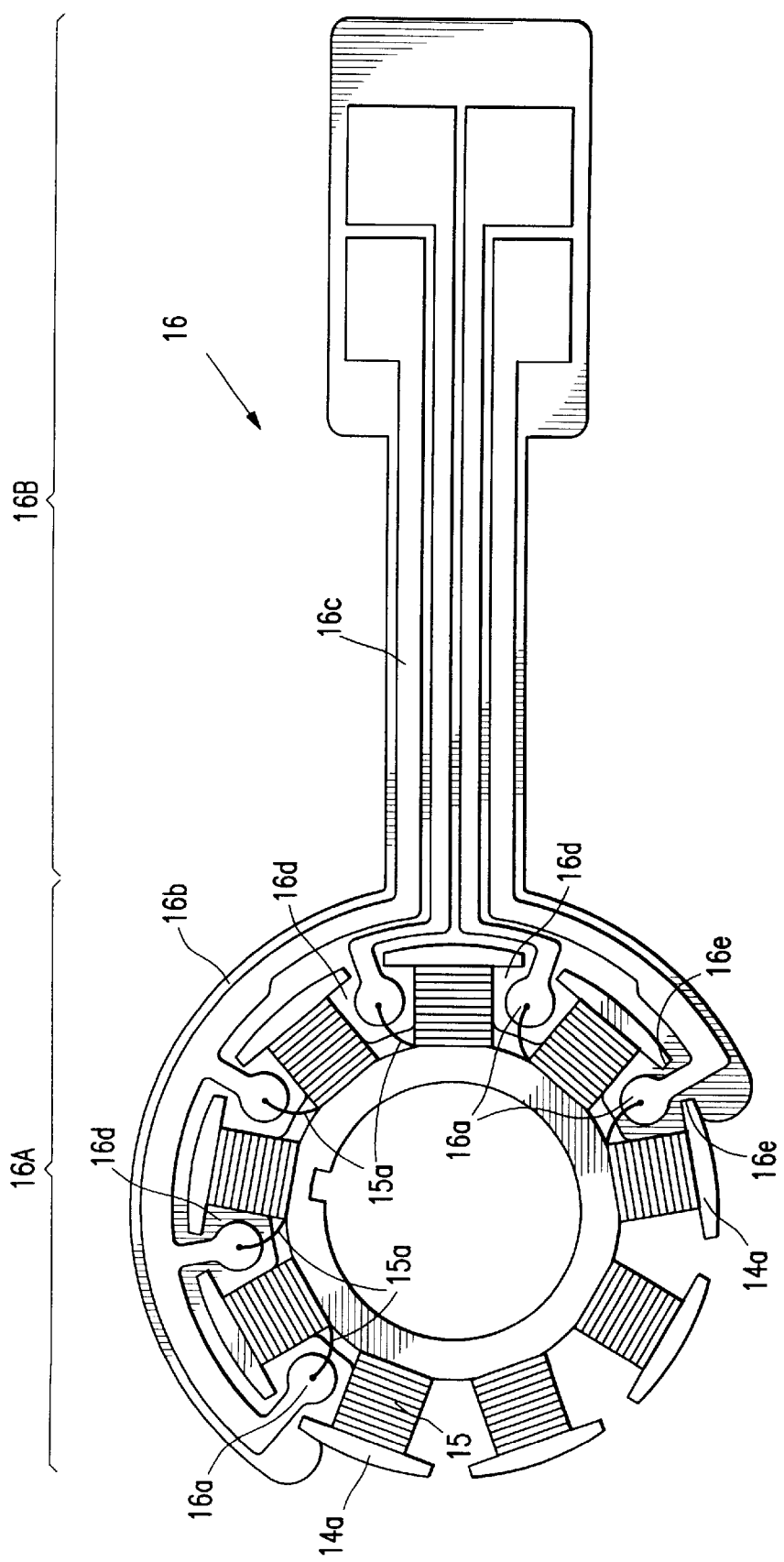
FIG. 6 shows a plane explanatory view which illustrates a combination of the coil-wound stator core assembly in FIG. 3 and the flexible circuit board (FPC) in FIG. 5.

A spindle motor of an outer-rotor type for a HDD, shown in FIG. 1 and FIG. 2, includes a stator assembly 10 as a fixed member and a rotor assembly 20 as a rotational member that is assembled to the stator assembly 10 from the upper side. The stator assembly 10 has a base frame 11 which is screwed to the fixed base (not shown). The base frame 11 is formed from metal material such as aluminum or the like to reduce its weight. A fixed shaft 12 made of stainless steel is mounted at a generally center area of the base frame 11, and a core holder 13 is axially formed to compose a ring-shaped wall portion in the base frame 11 in such a manner that the core holder 13 surrounds the fixed shaft 12 with a radial space.

A stator core 14 composed of a stacked layered body of magnetic steel sheets is fitted on a mounting face provided on an outer peripheral wall of the core holder 12. Especially shown in FIG. 3 through FIG. 6, a stator coil 15 is wound respectively around each of a plurality of salient pole sections 14a which is formed to extend radially in the stator core 14 to provide a coil-wound stator core assembly. The stator coils 15 in the present embodiment are comprised of 3-phase coil-windings consisting of U-, V- and W-phases. The six lead portions 15a of the coil-windings are three terminal portions of each phase and three common lines and they are drawn out from the stator core 14. Each of the six lead portions 15a is electrically connected to each of land portions 16a of a flexible circuit board (FPC) 16 by way of soldering.

More in detail, the flexible circuit board (FPC) 16 is provided with a flexible main body portion 16b which is of sheet-shape. The flexible main body portion 16b has wiring circuit patterns 16c which is connected with the land portions 16a. The flexible circuit board (FPC) 16 is comprised of a circular-shaped portion 16A which is formed to surround an outer peripheral side of the stator core 14 over about half the circle and of a straight-shaped portion 16B which extends in a radial direction from one part of the peripheral portion of the circular-shaped portion 16A toward outside of the motor.

In an inner circumference portion of the circular-shaped portion 16A, six elastic extending portions 16d which has a land portion 16a respectively is provided so as to extend toward an inner and center direction. Each of the elastic extending portions 16d is formed in such a manner that it can locate in a slot portion between two salient pole sections 14a of the stator core 14. An inner protruding portion, i.e., a free end portion of each of the elastic extending portions 16d is provided with a land portion 16a respectively. And each of the lead portions 15a of the stator coils 15 is soldered to each of the land portions 16a of the elastic extending portions 16d.

The wiring circuit patterns 16c which are formed to extend from six land portions 16a are compiled to four parallel wiring circuit patterns 16c and gathered in one place to extend along a radial direction of the straight-shaped portion 16B toward the outside. The straight-shaped portion 16B is guided along a concave groove (not shown) provided in the base frame 11 and the straight-shaped portion 16 B is drawn out in an outer portion in a radial direction of the base frame 11 through a penetrated hole 11a which is formed in an axial direction (see FIG. 1). An adhesive material is filled in the penetrated hole 11a, thereby when the motor is mounted to the main frame of a HDD, dust is prevented from entering into the motor from outside and the cleanliness is maintained.

Figure 7:
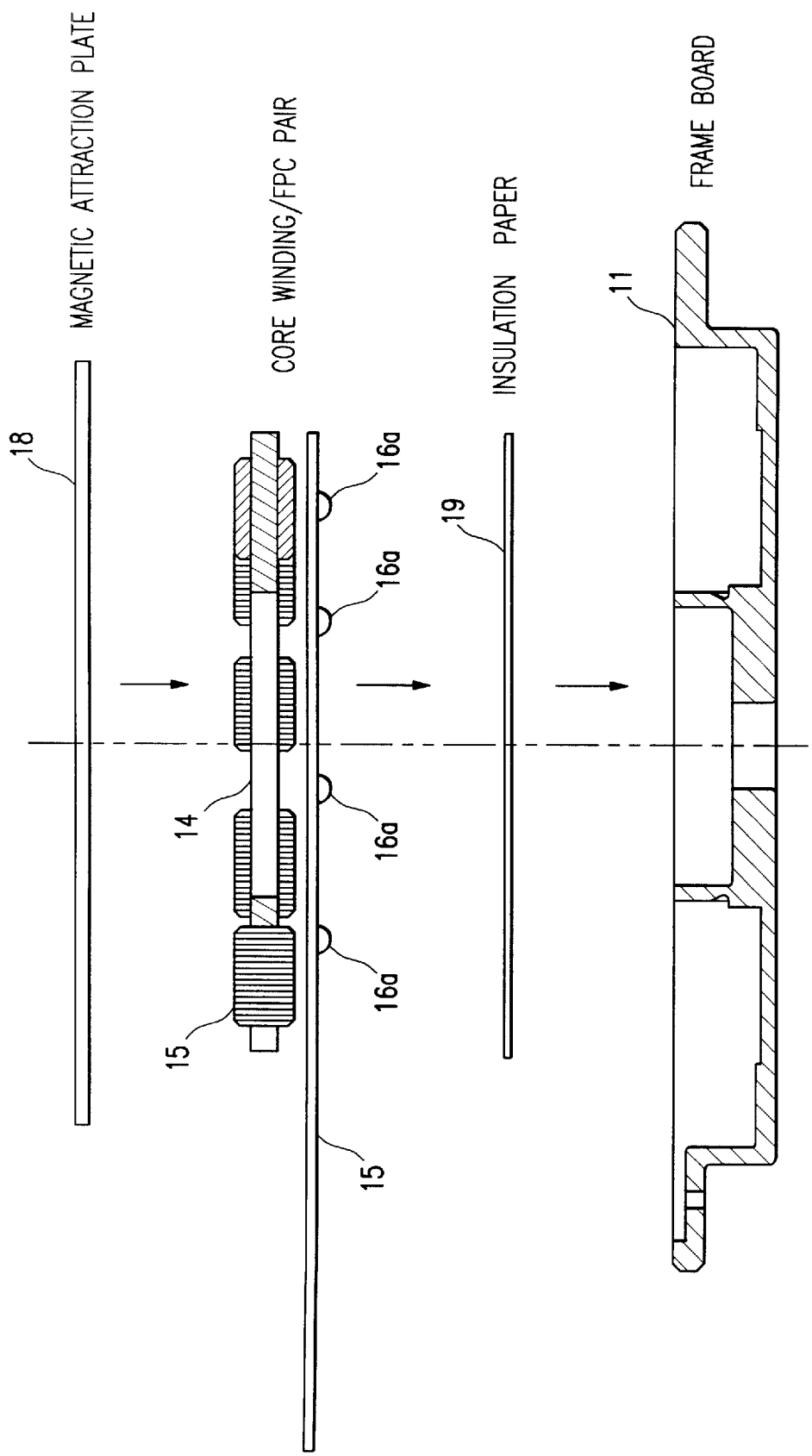
FIG. 7 shows an explanatory assembly view that illustrates a process for mounting the coil-wound stator core assembly and the flexible circuit board (FPC) shown in FIG. 6 to a base frame.

In order to assemble the flexible circuit board 16 to the base frame 11, as shown in FIG. 7, firstly the land portions 16a of the flexible circuit board 16 is soldered with the stator coils 15 of the coil-wound stator core assembly and they are made as one unit together.

In order to do soldering the lead portions 15a of the stator coils 15 to each of the land portions 16a of the elastic extending portions 16d, the flexible circuit board 16 and the coil-wound stator core assembly are mounted to a jig in such a manner that the flexible circuit board 16 is positioned upper side of the coil-wound stator core assembly, which is in a upside down state with respect to that shown in FIG. 7. As a result, the lead portions 15a of the stator coils 15 can be soldered to the land portions 16a of the flexible circuit board 16 from upper side. For this soldering, it is perferable to provide a support pin located under the land portions 16a to prevent from bending the elastic extending portions 16d downwards when the lead portions 15a are soldered to the land portions 16a.

And, the flexible circuit board 16 integrated with the coil-wound stator core assembly is placed on the base frame 11 in such a manner that the flexible circuit board 16 is mounted on an insulator member (insulating paper) 19 which is stuck on the inside surface of the base frame 11 (see FIG. 1). Subsequently, a ring-shaped magnetic attraction plate 18 is mounted on the base frame 11 and the flexible circuit board 16 from the upper side of the coil-wound stator core assembly and thus the flexible circuit board 16 is pressed down in an axial direction by the ring-shaped magnetic attraction plate 18 as shown in FIG. 1. As a result, the flexible main body portion 16b of the flexible circuit board 16 is firmly fixed to the base frame 11 through the insulator member (insulating paper) 19.

In this way, the flexible main body portion 16b of the flexible circuit board 16 is mounted to the base frame 11 by the magnetic attraction plate 18, and a soldered part of the land portion 16a which is provided in a free end portion of the elastic extending portions 16d is located on the side of the base frame 11 and thus pushed against the base frame 11 through the insulator member (insulating paper) 19. Especially as shown in FIG. 1, after the flexible circuit board 16 is mounted to the base frame 11, the free end portion of each of the elastic extending portions 16d is bent upwards by the soldered part of the land portion 16a and is in a slanted state. Thus each of the soldered part of the land portion 16a is pushed and held against the surface of the base frame 11 strongly in an axial direction (a down direction in FIG. 1) by way of the elastic force originated by the bending of the elastic extending portion 16d.

Also, in a connecting portion of each of the elastic extending portions 16d with the flexible main body portion 16b, a cut portion 16e is provided so as to attain easy bending of each of the elastic extending portions 16d. In addition, the elastic extending portions 16d are preferably formed to be accommodated into the space between the salient pole sections 14a of the stator core 14 after assembling the flexible circuit board 16 and the coil-wound stator core assembly.

In FIG. 1 and FIG. 2, the bearing sleeve 21 as a rotation bearing member composing the rotor assembly 20 is rotatably mounted to the fixed shaft 12 extended in an axial direction from the base frame 11. The bearing sleeve 21 is formed from copper alloy material such as phosphor bronze which is a readily workable material in order to machine, for example, a bearing hole of a small diameter. A dynamic pressure surface formed on an internal peripheral surface of the bearing hole in the bearing sleeve 21 is provided to oppose in a radial direction a dynamic pressure surface formed on the outer peripheral surface of the fixed shaft 12. And radial dynamic pressure bearing portions RB are formed to have a minute bearing gap between the two dynamic pressure surfaces. The dynamic pressure surface of the bearing sleeve 21 and that of the fixed shaft 12 in the radial dynamic pressure bearing RB are disposed to face each other over about a several • m gap in a circumferential direction. A specified lubrication fluid such as lubrication oil or magnetic fluid is filled in the bearing gap space and is held by way of capillary force for generating a dynamic pressure.

In addition, radial dynamic pressure generating grooves of a herringbone shape (not shown) are formed concavely on at least either of the dynamic pressure surfaces of the bearing sleeve 21 and the fixed shaft 12. The radial dynamic pressure generating grooves are, for example, formed in a circumferential direction and provided with two parts divided into 2 blocks in an axial direction. During rotation, the lubrication fluid is pressurized by way of a pumping operation by the radial dynamic pressure generating grooves and thus a dynamic pressure is generated and the rotor hub 23 and the bearing sleeve 21 are floated and supported with respect to the fixed shaft 12 by the dynamic pressure force of the lubrication fluid.

A ring-shaped engagement member 17 is fitted to an upper end portion of the fixed shaft 12. The bearing sleeve 21 is prevented from moving in an axial direction by way of the engaging with the engagement member 17 so that the bearing sleeve 21 may not come off or dislocate in an axial direction by external forces such as shock or vibration.

A thrust plate 22 composing the thrust bearing is mounted in an opening portion of a large diameter which is formed in the upper end of the bearing sleeve 21. A protruding part 12a which is formed on the top surface (upper end surface shown in FIG. 1) of the protrusion side of the fixed shaft 12 is formed as a point contact with respect to the inside surface of the thrust plate 22 (the under surface shown in FIG. 1), and a so-called pivot bearing is formed.

A rotor hub 23 composing the rotor assembly 20 is mounted in an outer peripheral surface of the bearing sleeve 21. A rotor hub 23 formed from metal alloys such as aluminum or iron metals is formed to a generally cup-shaped member so as to carry a recording disk such as a magnetic disc (not shown). A joining aperture 23a is provided in a center section of the rotor hub 23 and the rotor hub 23 is joined unitedly by press fitting or shrink fitting with respect to an outer peripheral surface of the bearing sleeve 21. The rotor hub 23 is provided with a tapped hole 23c in a holding portion 23b for holding a recording disk, and a circular rotor magnet 24 is fixed by an adhesive material in an internal peripheral surface of the outer peripheral flange portion 23d that is formed unitedly with the holding portion 23b. The rotor magnet 24 is arranged circumferentially facing in close proximity to the outer peripheral surface of each of the salient pole sections 14a of the stator core 14.

A magnetic attraction plate 18 consisting of a ring-shaped magnetic material such as silicon steel or permalloy is fixed on an inside surface of the base frame 11 (an upper surface in FIG. 1), and the magnetic attraction plate 18 opposes the rotor magnet 24 in an axial direction. The magnetic attraction plate 18 is a member for attracting the whole rotor assembly 20 to the base frame 11 by way of a magnetic attraction force acting between the rotor magnet 24 and the magnetic attraction plate 18. Due to the attraction force between the magnetic attraction plate 18 and the rotor magnet 24, the protruding part 12a of the fixed shaft 12 and the thrust plate 22 comprising the pivot bearing are always maintained in a contact state. As a result, an axial position restriction is performed for the whole rotor assembly 20 in a thrust direction, and thus, for example, even if the motor is placed and employed in a reverse attitude upside down, the motor may be used without problem. The magnetic attraction member 18 may be preferably provided with a concave groove to guide the flexible circuit board 16.

Figure 8:
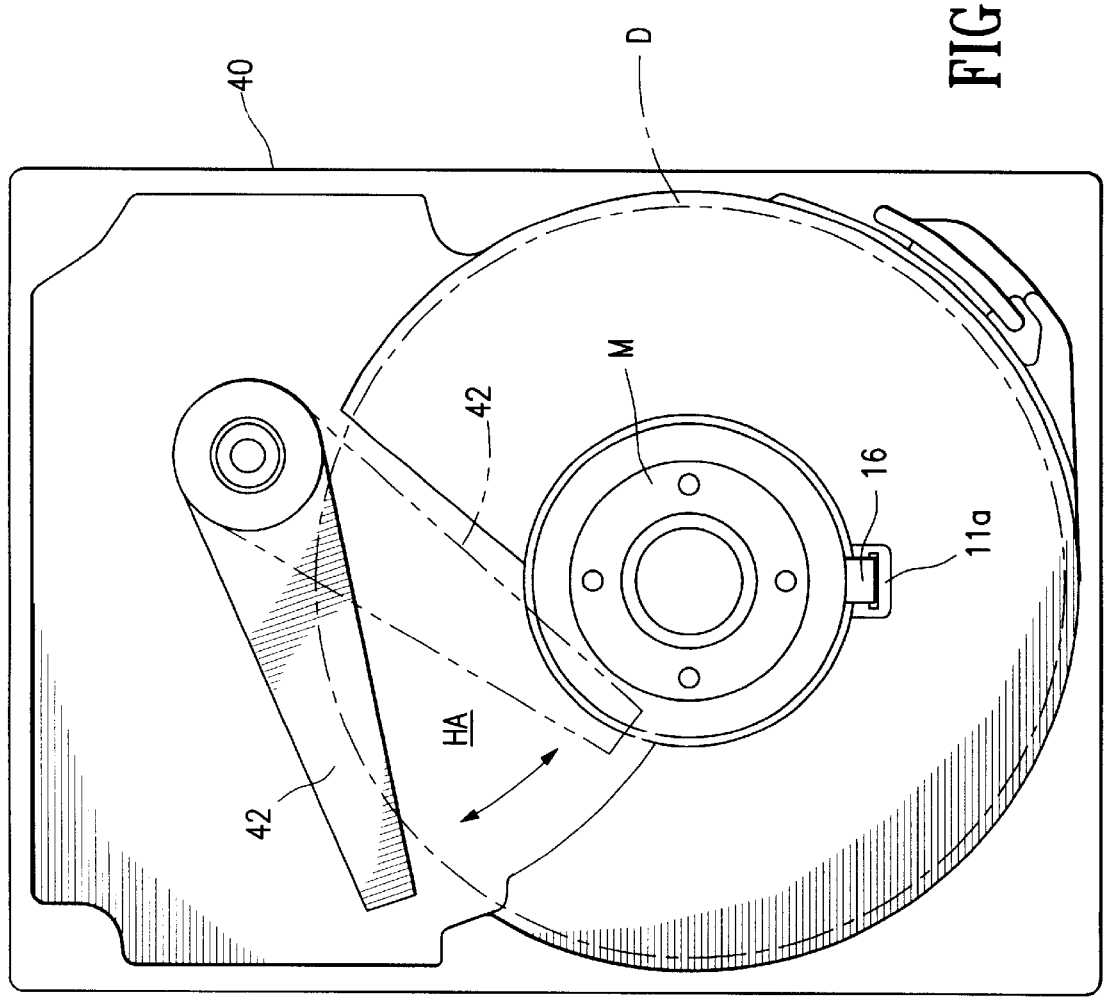
FIG. 8 shows a plane explanatory view that illustrates the motor shown in FIG. 1 installed in a hard disk drive (HDD).
Figure 9:
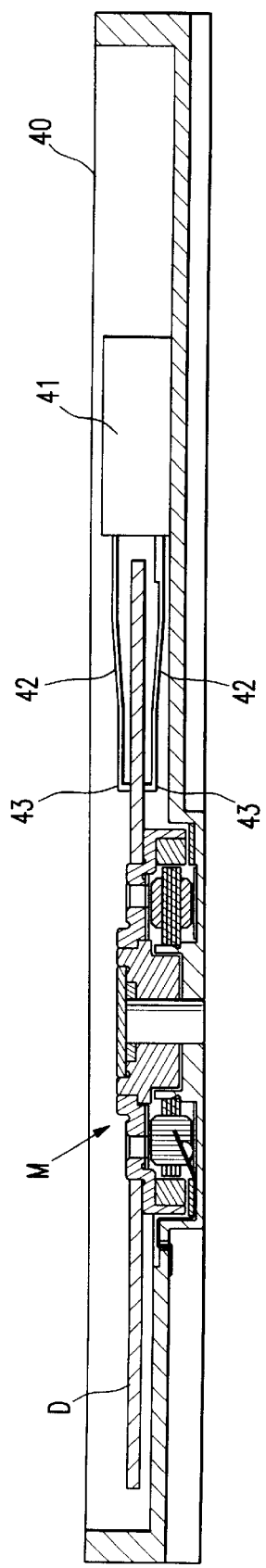
FIG. 9 is a longitudinal section explanatory view of the hard disk drive (HDD) in FIG. 8.

A motor having such an above-described construction, for example, is built into and used for a hard disk drive (HDD) as shown in FIG. 8 and FIG. 9. A motor M on which a disk D is fitted is mounted inside of a sealed case 40, and each head 43 held on tip portions of a pair of head arms (gimbal) 42 provided on an actuator 41 is disposed to scan a surface of the disk D.

The head arms 42 with the head 43 are moved within a scanning zone HA which is a generally sector shape in a plane view as shown in FIG. 8. The position of the penetrated hole 11a (see FIG. 1) for drawing the flexible circuit board 16 out of the motor is arranged in a circumferential direction except the range of the scanning zone HA for the head arm 42 and the head 43. Consequently, the height dimension of the drive device may not be increased.

According to the present embodiment, the soldered part of the land portion 16a is always pushed against the surface of the base frame 11 by way of an elastic force produced by the bending of the free end portion of the elastic extending portion 16d. That is because the soldered part is formed on the undersurface of the flexible circuit board 16, and when the flexible main body portion 16b of the flexible circuit board 16 is mounted to the base frame 11, the free end portion of the elastic extending portion 16d is lifted up and bent upward due to the soldered part contacting with the upper surface of the insulator member. Therefore, the soldered part of the land portion 16a is held in a stable condition by way of the bending force, so the soldered part does not happen to jump off as may happen in the prior art.

According to one embodiment of the present invention, a cut portion 16e for assisting the bending of the elastic extending portion 16d is provided in a connecting portion between the flexible main body portion 16b and the elastic extending portion 16d in the flexible circuit board 16. As a result, the bending of the elastic extending portion 16d is performed easily and well.

According to the present embodiment, the insulator member (insulating paper) 19 is mounted on the surface of the base frame 11 through which the land portion 16a is pressed, therefore the electrical reliability of the motor is attained.

In addition, according to the present embodiment, the magnetic attraction member 18, which attracts the rotor magnet 24 in an axial direction to regulate the position of the rotor assembly 20 in a thrust direction, is provided so as to hold the flexible main body portion 16b of the flexible circuit board 16 to the base frame 11. As a result, an extra member for fixing the flexible circuit board 16 is unnecessary and a satisfactory fixed state is obtained with low cost.

In addition, according to the present embodiment, a guide portion such as a groove is formed in the base frame 11 and/or the magnetic attraction member 18 to draw the flexible main body portion 16b of the flexible circuit board 16 out of the motor. Therefore, in such an outer-rotor motor, the flexible circuit board 16 can be disposed easily and precisely along the guide portion.

In addition, according to the present embodiment, the flexible main body portion 16b of the flexible circuit board 16 is disposed in an area except for the moving range HA of the head 43 or actuator 41. Consequently, the flexible circuit board 16 and the moving range of the head and the actuator are completely separated from each other in a noninterference state and a thinner motor can be obtained because they are not necessary to overlap in an axial direction.

Figure 10:
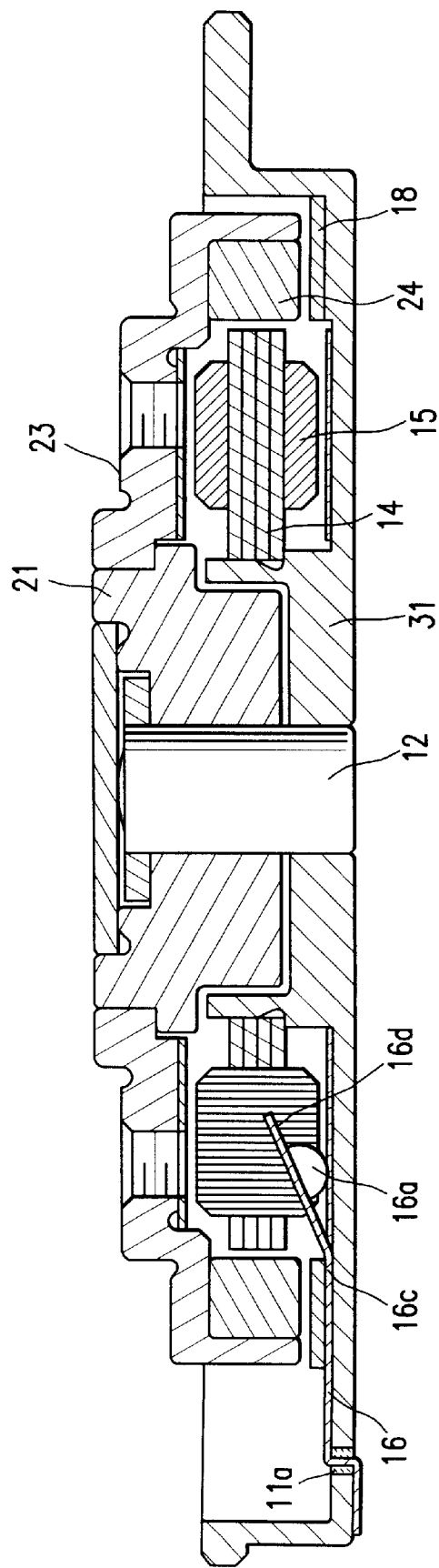
FIG. 10 shows a longitudinal section explanatory view of a motor according to other embodiment of the present invention.
Figure 11:
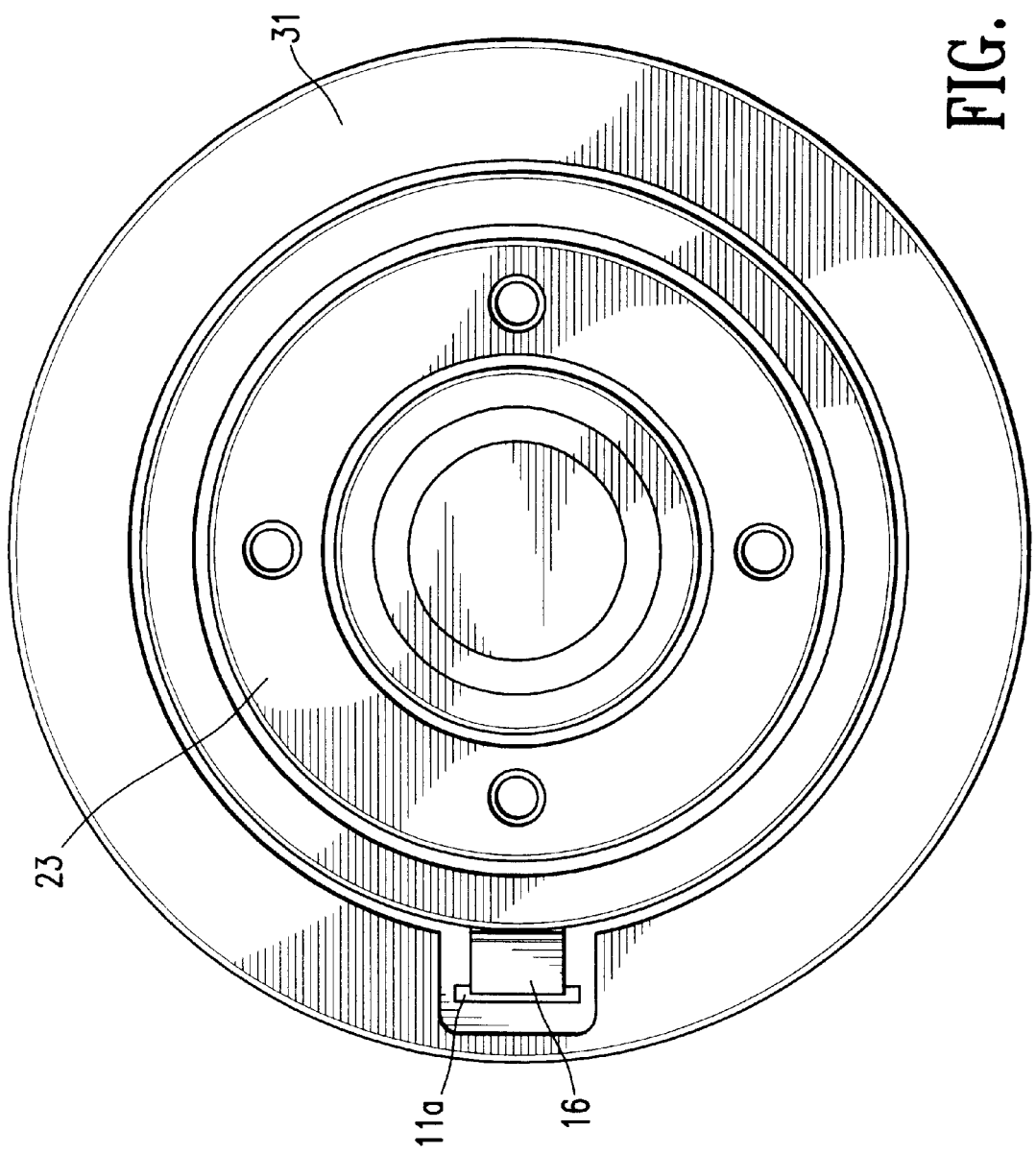
FIG. 11 shows a plane explanatory view of the motor shown in FIG. 10.

An embodiment shown in FIG. 10 and FIG. 11 is a motor wherein the same reference number is referred to the same element described in the above-mentioned embodiment. According to this embodiment, a bottom surface of the base frame 31 is formed in a non-circular flat shape and thus the flexible circuit board 16 can be extended flatly and drawn out of the motor without bending the flexible circuit board 16 in an axial direction as the above-mentioned embodiment (see FIG. 1).

Figure 12:
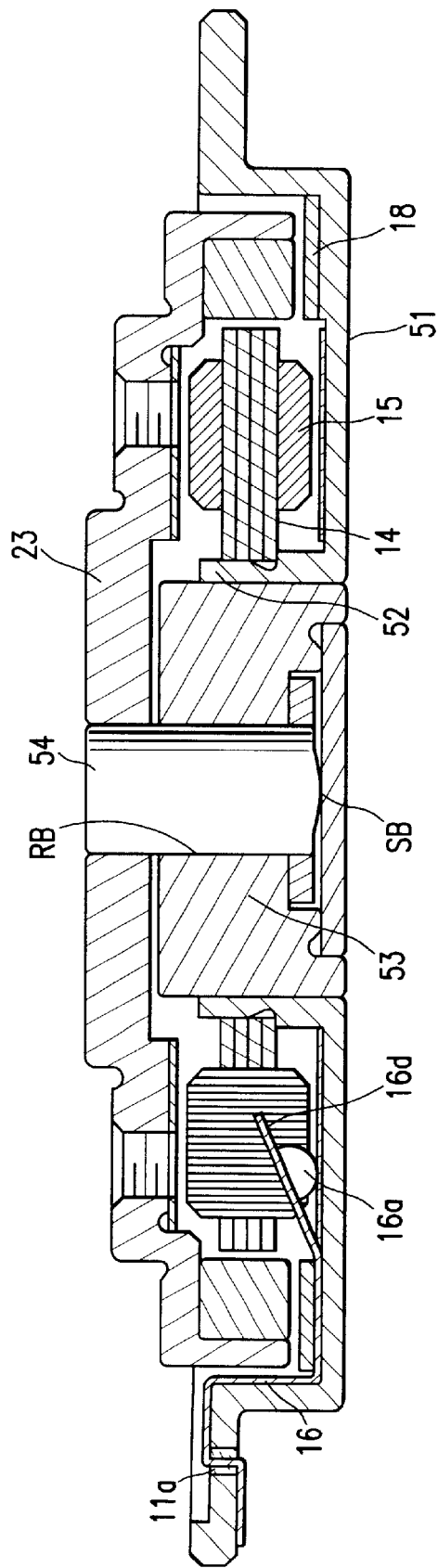
FIG. 12 shows a longitudinal section explanatory view of a motor according to a further embodiment of the present invention.

In addition, an embodiment shown in FIG. 12 is a shaft rotation type motor wherein a bearing/core holder 52 is provided in generally center area of the base frame 51 and a bearing sleeve 53 as a fixed bearing member is fixed within the bearing/core holder 52. The rotor shaft 54 provided with the rotor hub 23 is rotatably supported by the bearing sleeve 53.

Figure 13:
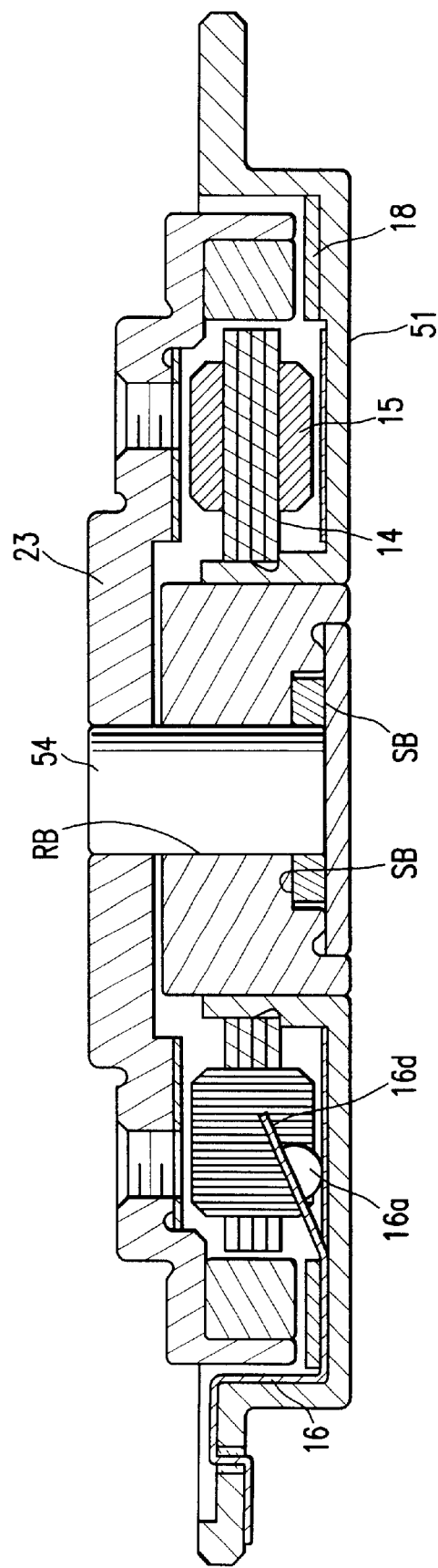
FIG. 13 shows a longitudinal section explanatory view of a motor according to a further embodiment of the present invention.

In the embodiment as shown in FIG. 12, a dynamic pressure bearing is used as a radial bearing portion RB and a pivot bearing is adopted as a thrust bearing SB. But in an embodiment shown in FIG. 13, a dynamic pressure bearing is also used as a thrust bearing portion SB.

Figure 14:
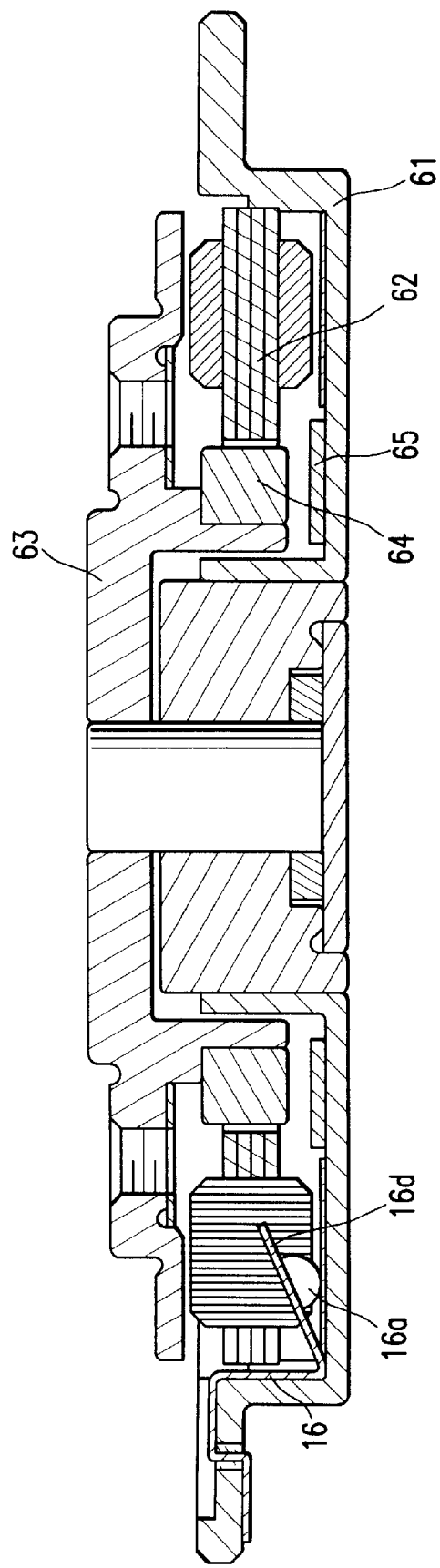
FIG. 14 shows a longitudinal section explanatory view of a motor according to a further embodiment of the present invention.

The embodiment shown in FIG. 14 is a motor of a shaft-rotation/inner-rotor type to which the present invention is applied. In this embodiment, a stator core 62 is mounted to an outer peripheral wall surface of a base frame 61 and a rotor magnet 64 is mounted to an external circumference portion of a rotor hub 63. A magnetic attraction plate 65 is mounted to the base frame 61 so as to face with the rotor magnet 64 in an axial direction. A flexible circuit board 16 is draw out from the motor through a mounting portion formed of the base frame 61 for the stator core 62.

Figure 15:
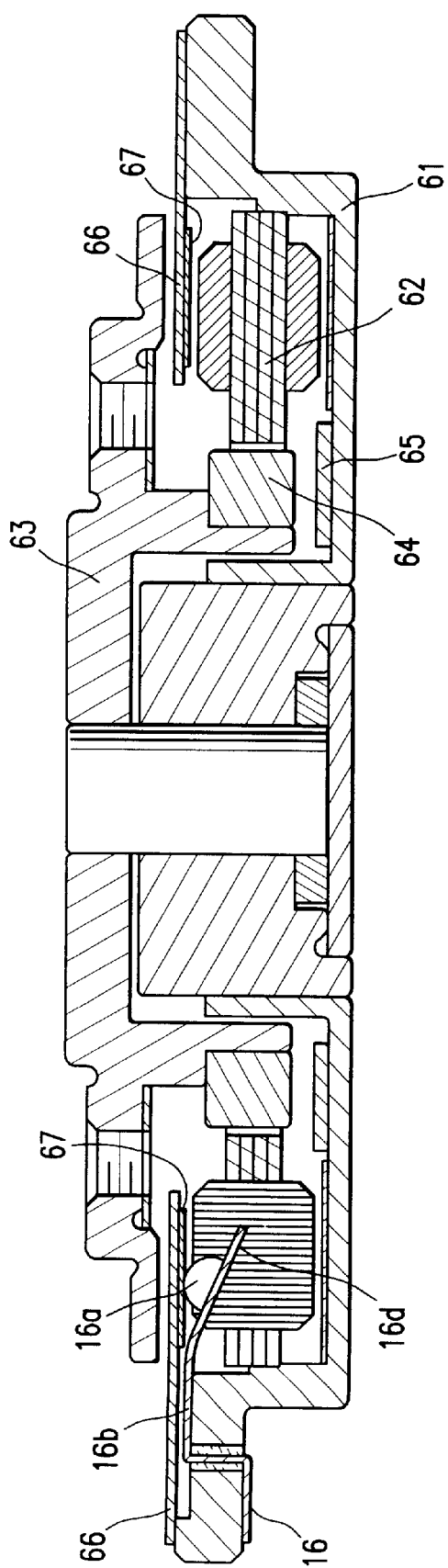
FIG. 15 shows a longitudinal section explanatory view of a motor according to a further embodiment of the present invention.
Figure 17B:
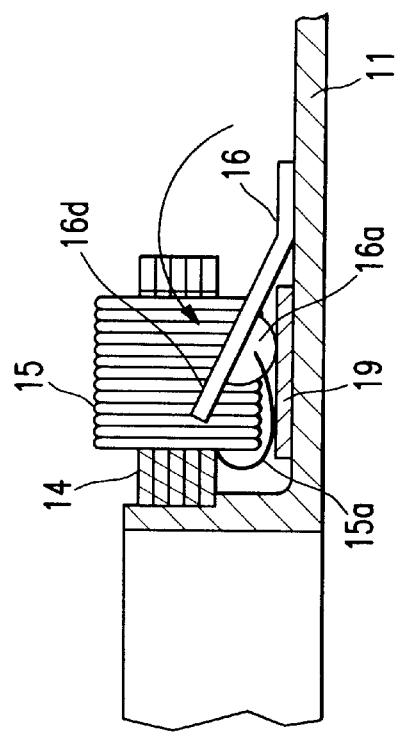
FIGS. 17a–17b shows an explanatory assembly view that illustrates next process for the stator coil and the land portion in FIG. 16.
Figure 17A:
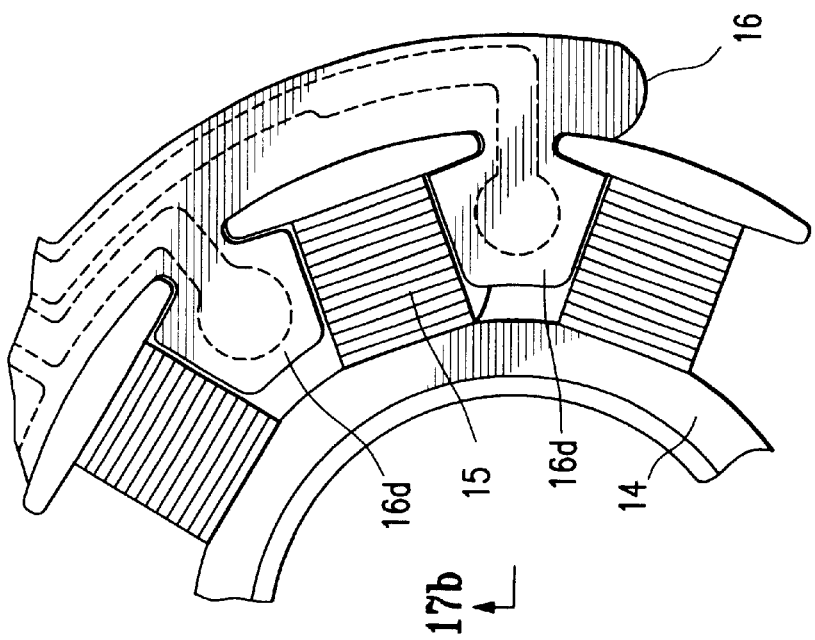
Figure 18:
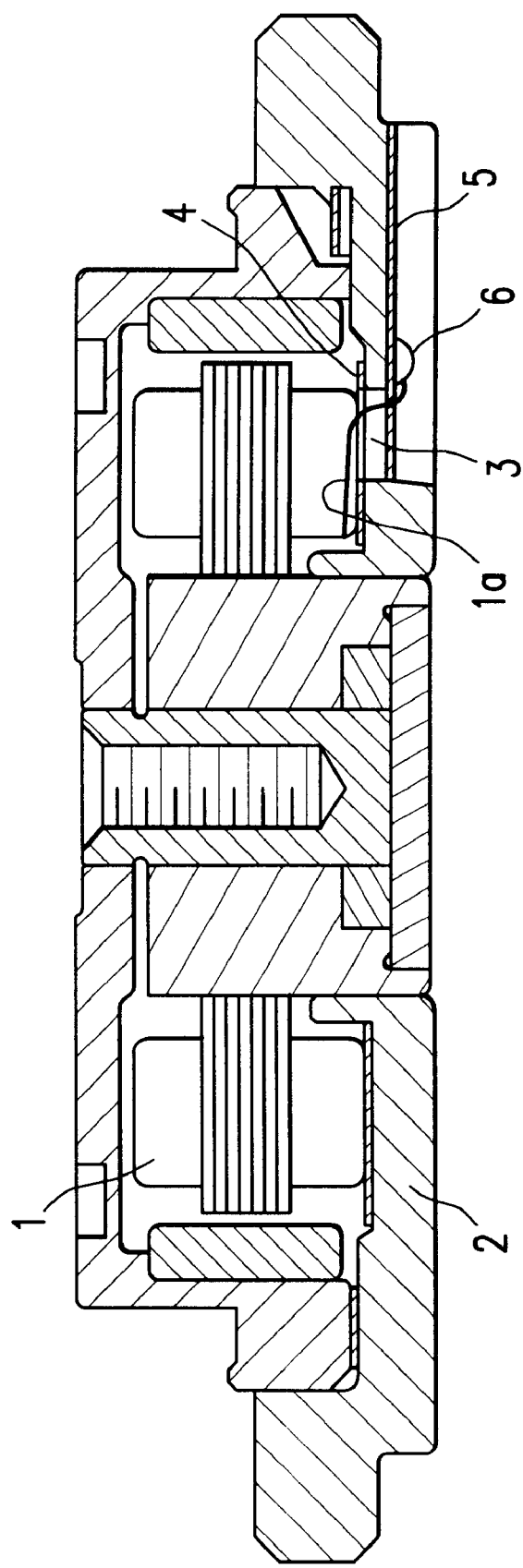
FIG. 18 shows a longitudinal section explanatory view that illustrates a conventional motor.

The embodiment shown in FIG. 15 is another motor of a shaft-rotation/inner-rotor type to which the present invention is applied. In this embodiment, the flexible main body portion 16b of the flexible circuit board 16 is fixed to the base frame 61 by a plate 66 which is mounted to the base frame 61. The soldered part of the land portion 16a is pushed against the under surface of the plate 66 through an insulator (insulating paper) 67 by way of elastic force which is produced by the bending down of the free end portion of the elastic extending portion 16d. These embodiments can obtain similar operations or effects as the above-mentioned embodiment.

The embodiments of the present invention are described above. However, needless to say, the present invention is not limited to the embodiments described above, and many modifications can be made without departing from the subject matter of the present invention.

For example, in the above-mentioned embodiments, as shown in FIG. 7, when the flexible circuit board 16 is assembled to the base frame 11, the land portions 16a of the flexible circuit board 16 is soldered with the stator coils 15 of the coil-wound stator core assembly and they are made as one unit in advance. However, in FIG. 16, an insulator (insulating paper) 19, a flexible circuit board 16, a coil-wound stator core assembly, and a magnetic attraction plate are placed on the base frame 1 in this order. The elastic extending portion 16d can be lifted and bent upward so that the soldered part of the land portions 16a of the flexible circuit board 16 may face upwards and can be soldered with the stator coils 15 of the coil-wound stator core assembly. After soldering, the soldered part of the land portion 16a is pushed against the surface of the base frame 11 by way of elastic force of the elastic extending portion 16d. In this case, the elastic extending portion 16d is preferably formed in size to bend easily between the salient pole sections 14a of the stator core 14.

Also, in the above-mentioned embodiments, the present invention is applied to a motor for hard disk drives (HDD). The present invention is not limited to a motor for hard disk drives, but can be similarly applied to motors for other types of disk drives used for other various apparatuses or to other various types of motors.

In a motor according to the present invention, the free end portion of the elastic extending portion is in a bending state by the flexible main body portion being fixed to a fixed member such as a base frame, and the land portion of the elastic extending portion is forcefully held by way of an elastic force by the bending. That is, the soldered portion which is formed on the land portion of the flexible circuit board is firmly pushed toward the side of the fixed member due to the elastic force of the elastic extending portion. Therefore, a thinner motor can be attained with a high reliability.

What is claimed is:

1. A motor comprising:

a shaft member;

a bearing member rotatable with the shaft member;

a base frame that supports the shaft member and the bearing member;

a rotor rotatably supported by the base frame;

a stator core mounted to the base frame and includes salient pole sections extending radially from the stator core and each of the plurality of salient pole sections is provided with stator coils wound around each of the salient pole sections; and a sheet-shaped flexible circuit board which has a flexible main body portion provided with land portions to which each of the terminal portions of the stator coils is electrically connected;

wherein the flexible main body portion of the flexible circuit board is provided with elastic extending portions extending between the salient pole sections, the land portion is formed on each of the elastic extending portions, the elastic extending portion is bent by the flexible main body portion being mounted to the fixed member, and each of the land portions of the elastic extending portions is pushed against a fixed member by the elastic force due to the bending.

2. The motor according to claim 1, wherein a cut portion for assisting bending of the elastic extending portion is provided in a connecting portion between the flexible main body portion and the elastic extending portion in the flexible circuit board.

3. The motor according to claim 1, wherein the fixed member for mounting the flexible main body portion thereto is the base frame.

4. The motor according to claim 1, wherein an insulation material is mounted on a surface of the fixed member on which the land portions are pressed.

5. The motor according to claim 1, wherein a rotor magnet is mounted to the rotor, a magnetic attraction member attracting the rotor magnet in an axial direction is mounted in a base frame for regulating an axial position of the rotor, and the flexible main body portion of the flexible circuit board is held to the base frame by the magnetic attraction member.

6. The motor according to claim 5, wherein a guide portion is provided in the group consisting of the magnetic attraction member and he base frame for drawing the flexible main body portion of the flexible circuit board outward from the motor.

7. The motor according to claim 1, wherein a guide portion is provided in either of the fixed member for the stator core and/or the base frame for drawing the flexible main body portion of the flexible circuit board outward from the motor.

8. The motor according to claim 1, wherein a drawing portion for drawing the flexible main body portion of the flexible circuit board from the inside of the motor to the outside is disposed except for an operating range of a head or a head actuator such that the drawing portion is not positioned in the same region of the operating range.

9. The motor according to claim 1, wherein a plate is attached to the base frame and each of the land portions of the elastic extending portions is pushed towards the plate.

10. The motor according to claim 1, wherein a drawing portion for drawing the flexible main body portion of the flexible circuit board from the inside of the motor to the outside is disposed except for an operating range of a head or a head actuator such that the drawing portion is not positioned in the same region of the operating range.

11. The motor according to claim 1, wherein a plate is attached to a base frame and each of the land portions of the elastic extending portions is pushed towards the plate.

12. A motor comprising:

a stator core mounted to a base frame and includes salient pole sections extending radially from the stator core and each of the plurality of salient pole sections is provided with stator coils wound around each of the salient pole sections; and a sheet-shaped flexible circuit board which has a flexible main body portion provided with land portions to which each of the terminal portions of the stator coils is electrically connected;

wherein the flexible main body portion of the flexible circuit board is provided with elastic extending portions extending between the salient pole sections, the land portion is formed on each of the elastic extending portions, the elastic extending portion is bent by the flexible main body portion being mounted to a fixed member, and each of the land portions of the elastic extending portions is pushed against the fixed member by the elastic force due to the bending.

13. The motor according to claim 12, wherein a cut portion for assisting bending of the elastic extending portion is provided in a connecting portion between the flexible main body portion and the elastic extending portion in the flexible circuit board.

14. The motor according to claim 12, wherein the fixed member for mounting the flexible main body portion thereto is the base frame.

15. The motor according to claim 12, wherein an insulation material is mounted on a surface of the fixed member on which the land portions are pressed.

16. The motor according to claim 12, wherein a rotor magnet is mounted to a rotor, a magnetic attraction member attracting the rotor magnet in an axial direction is mounted in a base frame for regulating an axial position of the rotor, and the flexible main body portion of the flexible circuit board is held to a base frame by the magnetic attraction member.

17. The motor according to claim 16, wherein a guide portion is provided in the group consisting of the magnetic attraction member and the base frame for drawing the flexible main body portion of the flexible circuit board outward from the motor.

18. A motor according to claim 12, wherein a guide portion is provided in either of the fixed member for the stator core and/or the base frame for drawing the flexible main body portion of the flexible circuit board outward from the motor.

19. A motor manufacturing method comprising:

mounting a stator core to a base frame, the stator core including salient pole sections extending radially from the stator core and each of the plurality of salient pole sections is provided with stator coils wound around each of the salient pole sections; and providing a sheet-shaped flexible circuit board which has a flexible main body portion provided with land portions to which each of the terminal portions of the stator coils is electrically connected;

wherein the flexible main body portion of the flexible circuit board is provided with elastic extending portions extending between the salient pole sections, the land portion is formed on each of the elastic extending portions, the elastic extending portion is bent by the flexible main body portion being mounted to a fixed member, and each of the land portions of the elastic extending portions is pushed against the fixed member by the elastic force due to the bending.

20. The motor manufacturing method according to claim 19, further comprising mounting an insulation material on a surface of the fixed member on which the land portions are pressed.

* * * * *